(12) United States Patent
Dai et al.

(10) Patent No.: US 10,916,185 B1
(45) Date of Patent: Feb. 9, 2021

(54) ARRAY SUBSTRATE, DISPLAY PANEL, DISPLAY DEVICE AND ARRAY-SUBSTRATE MANUFACTURING METHOD

(71) Applicant: Xiamen Tianma Micro-Electronics Co., Ltd., Xiamen (CN)

(72) Inventors: Jiaxiang Dai, Xiamen (CN); Zhaokeng Cao, Shanghai (CN); Shaorong Yu, Shanghai (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 16/730,930

(22) Filed: Dec. 30, 2019

(30) Foreign Application Priority Data

Sep. 30, 2019 (CN) .......................... 2019 1 0944054

(51) Int. Cl.
*G09G 3/32* (2016.01)
*H01L 33/38* (2010.01)

(52) U.S. Cl.
CPC .............. *G09G 3/32* (2013.01); *H01L 33/382* (2013.01); *G09G 2300/0426* (2013.01); *G09G 2300/0876* (2013.01); *H01L 2933/0016* (2013.01)

(58) Field of Classification Search
CPC ............. G09G 3/32; G09G 2300/0426; G09G 2300/0876; H01L 33/382; H01L 2933/0016
See application file for complete search history.

(56) References Cited

U.S. PATENT DOCUMENTS

2020/0091268 A1\* 3/2020 Cho .................... H01L 27/3265
2020/0152663 A1\* 5/2020 Li ....................... H01L 27/1251

FOREIGN PATENT DOCUMENTS

CN  107403804 A  11/2017
CN  109216374 A  1/2019

\* cited by examiner

*Primary Examiner* — Gene W Lee
(74) *Attorney, Agent, or Firm* — Alston & Bird LLP

(57) ABSTRACT

Disclosed are an array substrate, a display panel, a display device and an array-substrate manufacturing method. The array substrate includes a substrate and a driving-circuit layer including multiple pixel circuits. Each of at least one pixel circuit includes a first thin film transistor and a second thin film transistor. The first thin film transistor includes a first active layer, a first gate electrode, a first A electrode and a first B electrode, and the first active layer includes a low temperature polycrystalline silicon active layer. The second thin film transistor includes a second active layer, a second gate electrode, a second A electrode and a second B electrode, and the second active layer includes an oxide semiconductor active layer.

15 Claims, 9 Drawing Sheets

ARRAY SUBSTRATE, DISPLAY PANEL, DISPLAY DEVICE AND ARRAY-SUBSTRATE MANUFACTURING METHOD

CROSS REFERENCE TO RELATED APPLICATION

This application claims the priority to Chinese Patent Application No. CN201910944054.6, filed on Sep. 30, 2019 and entitled "ARRAY SUBSTRATE, DISPLAY PANEL, DISPLAY DEVICE AND ARRAY-SUBSTRATE MANUFACTURING METHOD", the disclosure of which is incorporated herein by reference in its entirety.

TECHNICAL FIELD

Embodiments of the present disclosure relate to the field of display technologies and, in particular, to an array substrate, a display panel, a display device and an array-substrate manufacturing method.

BACKGROUND

A low temperature polycrystalline oxide (LTPO) technology is a technology for manufacturing both a low temperature polycrystalline silicon thin film transistor and an oxide semiconductor thin film transistor on the same backplate. The low temperature polycrystalline silicon thin film transistor has advantages of a high switching speed and small power consumption. The oxide semiconductor thin film transistor has advantages of high carrier mobility, low deposition temperature and high transparency. The LTPO technology may give full play to the advantages of the low temperature polycrystalline silicon thin film transistor and the oxide semiconductor thin film transistor, thereby ensuring good display performance of a display device.

However, optimal performance of the LTPO technology is difficult to achieve since an oxide semiconductor active layer of the oxide semiconductor thin film transistor is damaged in a current manufacturing process.

SUMMARY

In view of this, embodiments of the present disclosure provide an array substrate, a display panel, a display device and an array-substrate manufacturing method to solve the problem in which an oxide semiconductor active layer of an oxide semiconductor thin film transistor is damaged in the manufacturing process of a low temperature polycrystalline silicon thin film transistor and the oxide semiconductor thin film transistor in the related art.

In a first aspect, an embodiment of the present disclosure provides an array substrate, which includes a substrate and a driving-circuit layer positioned on the substrate.

The driving-circuit layer includes multiple pixel circuits.

Each of at least one pixel circuit includes a first thin film transistor, a second thin film transistor and a capacitor.

The first thin film transistor includes a first active layer, a first gate electrode, a first A electrode and a first B electrode, and the first active layer includes the low temperature polycrystalline silicon active layer. The second thin film transistor includes a second active layer, a second gate electrode, a second A electrode and a second B electrode, and the second active layer includes the oxide semiconductor active layer.

Along a direction perpendicular to a plane where the substrate is positioned, a film where the first active layer is positioned, a film where the first A electrode is positioned, a film where the first B electrode is positioned, and a film where the first gate electrode is positioned are all positioned between a film where the second active layer is positioned and the substrate.

A film where the second A electrode is positioned and a film where the second B electrode is positioned are both positioned on one side, facing away from the substrate, of the film where the second active layer is positioned.

The second gate electrode is positioned on one side, facing the substrate, of the second active layer.

The first A electrode is disposed in a different layer than the first B electrode.

The first A electrode is disposed in the same layer as the second gate electrode.

In a second aspect, an embodiment of the present disclosure provides a display panel, which includes the array substrate described in the first aspect, an opposing substrate disposed opposite to the array substrate, and multiple light-emitting elements disposed between the array substrate and the opposing substrate.

The multiple pixel circuits are used for driving the multiple light-emitting elements to emit light.

In a third aspect, an embodiment of the present disclosure further provides a display device, which includes the display panel described in the second aspect.

In a fourth aspect, an embodiment of the present disclosure provides an array-substrate manufacturing method, which includes the steps described below.

A substrate is provided.

A driving-circuit layer is formed on the substrate. The driving-circuit layer includes multiple pixel circuits. Each of at least one pixel circuit includes a first thin film transistor, a second thin film transistor and a capacitor. The first thin film transistor includes a first active layer, a first gate electrode, a first A electrode and a first B electrode, and the first active layer includes the low temperature polycrystalline silicon active layer. The second thin film transistor includes a second active layer, a second gate electrode, a second A electrode and a second B electrode, and the second active layer includes the oxide semiconductor active layer. Along a direction perpendicular to a plane where the substrate is positioned, a film where the first active layer is positioned, a film where the first A electrode is positioned, a film where the first B electrode is positioned, and a film where the first gate electrode is positioned are all positioned between a film where the second active layer is positioned and the substrate. A film where the second A electrode is positioned and a film where the second B electrode is positioned are both positioned on one side, facing away from the substrate, of the film where the second active layer is positioned. The first A electrode is disposed in a different layer than the first B electrode. The first A electrode is disposed in the same layer as the second gate electrode.

In the array substrate, the display panel, the display device and the array-substrate manufacturing method provided by the embodiments of the present disclosure, the film where the first active layer is positioned, the film where the first A electrode is positioned, the film where the first B electrode is positioned, and the film where the first gate electrode is positioned are all positioned between the film where the second active layer is positioned and the substrate along the direction perpendicular to the plane where the substrate is positioned. This can prevent the second active layer, that is, the oxide semiconductor active layer, from being damaged to solve the problem in which the oxide semiconductor active layer of the oxide semiconductor thin film transistor is damaged in the manufacturing process of the low temperature polycrystalline silicon thin film transistor and the oxide semiconductor thin film transistor in the related art, and give full play to the advantages of the oxide semiconductor thin film transistor and the low temperature polycrystalline silicon thin film transistor, thereby improving the display performance. Additionally, the first A electrode and the second gate electrode are disposed in the same layer and can be manufactured in the same manufacturing process by using the same mask plate without mask plates manufactured for the first A electrode and the second gate electrode separately. This can decrease the number of masks used in the array-substrate manufacturing method, thereby reducing the process cost and simplifying the process steps. Additionally, the first A electrode and first B electrode are positioned in different films. This can avoid reserving certain space along a direction parallel with the film when the first A electrode and the first B electrode are positioned in the same film, thereby reducing the occupation space of each of at least one pixel circuit and improving the pixel resolution of the display device.

DETAILED DESCRIPTION

Figure 1:
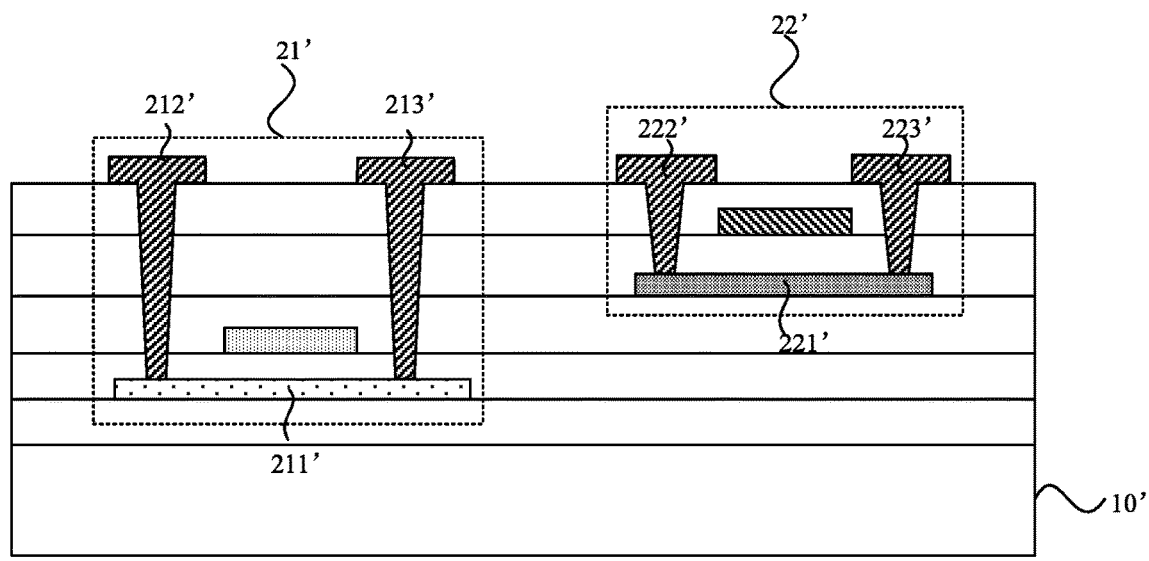
FIG. 1 is a structural diagram of an array substrate in the related art.

Hereinafter the present disclosure will be further described in detail in conjunction with drawings and embodiments. It is to be understood that the embodiments set forth below are merely intended to illustrate and not to limit the present disclosure. Additionally, it is to be noted that, for ease of description, only part, not all, of the structures related to the present disclosure are illustrated in the drawings.

FIG. 1 is a structural diagram of an array substrate in the related art. Referring to FIG. 1, the array substrate includes a substrate 10', and a low temperature polycrystalline silicon thin film transistor 21' and an oxide semiconductor thin film transistor 22' positioned on one side of the substrate 10'. The low temperature polycrystalline silicon thin film transistor 21' includes a low temperature polycrystalline silicon active layer 211', a first source electrode 212' and a first drain electrode 213'. The oxide semiconductor thin film transistor 22' includes an oxide semiconductor active layer 221', a second source electrode 222' and a second drain electrode 223'. The low temperature polycrystalline silicon active layer 211' is positioned on one side, facing the substrate 10', of the first source electrode 212' and first drain electrode 213'. The oxide semiconductor active layer 221' is positioned on one side, facing the substrate 10', of the second source electrode 222' and the second drain electrode 223'. The first source electrode 212', the first drain electrode 213', the second source electrode 222' and the second drain electrode 223' are disposed in the same layer. The low temperature polycrystalline silicon active layer 211' needs to be cleaned by using hydrofluoric acids when the first source electrode 212' and the first drain electrode 213' are manufactured, so that impurities on a surface of the low temperature polycrystalline silicon active layer 211' is prevented from affecting the effect of electrical contact between the first source electrode 212' and the low temperature polycrystalline silicon active layer 211' and between the first drain electrode 213' and the low temperature polycrystalline silicon active layer 211'. However, the first source electrode 212', the first drain electrode 213', the second source electrode 222' and the second drain electrode 223' are disposed in the same layer, and their respective vias through which the first source electrode 212', the first drain electrode 213', the second source electrode 222' and the second drain electrode 223' are connected to the active layers are manufactured simultaneously in a manufacturing process, so the oxide semiconductor active layer 221' is damaged by the hydrofluoric acids when the low temperature polycrystalline silicon active layer 211' is cleaned by using the hydrofluoric acids. This affects the performance of the oxide semiconductor thin film transistor, thereby affecting the display effect of the display device.

Based on the above technical problem, an embodiment of the present disclosure provides an array substrate, which includes a substrate and a driving-circuit layer positioned on the substrate. The driving-circuit layer includes multiple pixel circuits. Each of at least one pixel circuit includes a first thin film transistor, a second thin film transistor and a capacitor. The first thin film transistor includes a first active layer, a first gate electrode, a first A electrode and a first B electrode, and the first active layer includes a low temperature polycrystalline silicon active layer. The second thin film transistor includes a second active layer, a second gate electrode, a second A electrode and a second B electrode, and the second active layer includes an oxide semiconductor active layer. Along a direction perpendicular to a plane where the substrate is positioned, a film where the first active layer is positioned, a film where the first A electrode is positioned, a film where the first B electrode is positioned, and a film where the first gate electrode is positioned are all positioned between a film where the second active layer is positioned and the substrate. A film where the second A electrode is positioned and a film where the second B electrode is positioned are both positioned on one side, facing away from the substrate, of the film where the second active layer is positioned. The second gate electrode is positioned on one side, facing the substrate, of the second active layer. The first A electrode is disposed in a different layer than the first B electrode. The first A electrode is disposed in the same layer as the second gate electrode.

According to the above technical solution, the film where the first active layer is positioned, the film where the first A electrode is positioned, the film where the first B electrode is positioned, and the film where the first gate electrode is positioned are all positioned between the film where the second active layer is positioned and the substrate. This can prevent the hydrofluoric acids from damaging the second active layer, that is, the oxide semiconductor active layer, when the low temperature polycrystalline silicon active layer is cleaned by using the hydrofluoric acids, and give full play to advantages of the oxide semiconductor thin film transistor and the low temperature polycrystalline silicon thin film transistor, thereby improving the display performance. Additionally, the first A electrode and the second gate electrode are disposed in the same layer and can be manufactured in the same manufacturing process by using the same mask plate without mask plates manufactured for the first A electrode and the second gate electrode separately. This can decrease the number of masks used in the array-substrate manufacturing method, thereby reducing the process cost and simplifying process steps. Additionally, the first A electrode and first B electrode are positioned in different films. This can avoid reserving certain space along a direction parallel with the film when the first A electrode and the first B electrode are positioned in the same film, thereby reducing the occupation space of each of at least one pixel circuit and improving the pixel resolution of the display device.

The above is the core idea of the present disclosure, and technical solutions in the embodiments of the present disclosure will be described clearly and completely in conjunction with the drawings in the embodiments of the present disclosure. Based on the embodiments of the present disclosure, all other embodiments obtained by those skilled in the art without creative work are within the scope of the embodiments of the present disclosure.

Figure 2:
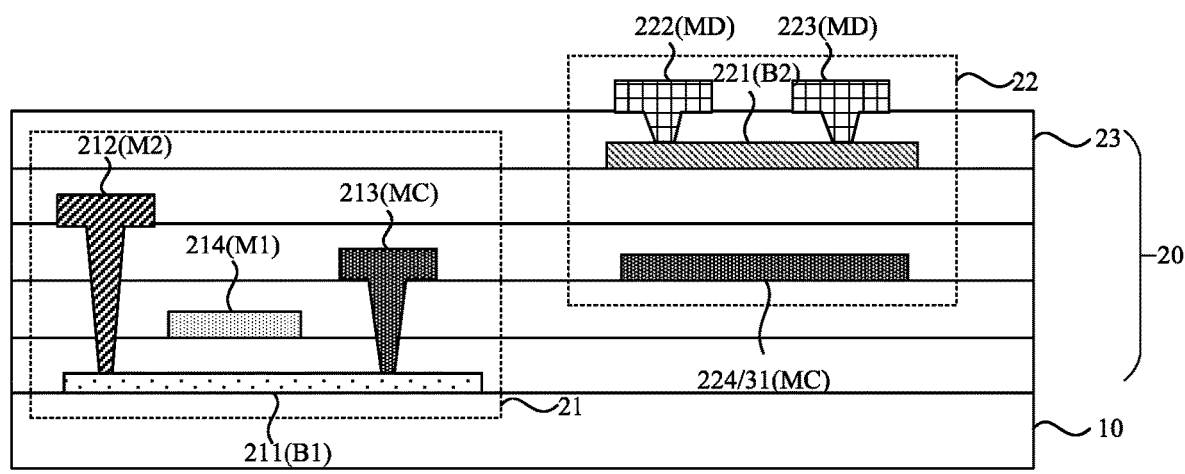
FIG. 2 is a structural diagram of an array substrate according to an embodiment of the present disclosure.

FIG. 2 is a structural diagram of an array substrate according to an embodiment of the present disclosure. Referring to FIG. 2, the array substrate includes a substrate 10 and a driving-circuit layer 20 positioned on the substrate 10. The driving-circuit layer 20 includes multiple pixel circuits. Each of at least one pixel circuit includes a first thin film transistor 21, a second thin film transistor 22 and a capacitor. The first thin film transistor 21 includes a first active layer 211, a first gate electrode 214, a first A electrode 213 and a first B electrode 212, and the first active layer 211 includes a low temperature polycrystalline silicon active layer. The second thin film transistor 22 includes a second active layer 221, a second gate electrode 224, a second A electrode 222 and a second B electrode 223, and the second active layer 221 includes an oxide semiconductor active layer. Along a direction perpendicular to a plane where the substrate 10 is positioned, a film where the first active layer 211 is positioned, a film where the first A electrode 213 is positioned, a film where the first B electrode 212 is positioned, and a film where the first gate electrode 214 is positioned are all positioned between a film where the second active layer 221 is positioned and the substrate 10. A film where the second A electrode 222 is positioned and a film where the second B electrode 223 is positioned are both positioned on one side, facing away from the substrate 10, of the film where the second active layer 221 is positioned. The second gate electrode 224 is positioned on one side, facing the substrate 10, of the second active layer 221. The first A electrode 213 is disposed in a different layer than the first B electrode 212. The first A electrode 213 is disposed in the same layer as the second gate electrode 224.

As shown in FIG. 2, both the first thin film transistor 21 and the second thin film transistor 22 are disposed on the substrate 10, the first thin film transistor 21 includes the low temperature polycrystalline silicon active layer, and the second thin film transistor 22 includes the oxide semiconductor active layer. This can ensure that the advantages of the low temperature polycrystalline silicon thin film transistor and the oxide semiconductor thin film transistor are given full play, thereby ensuring good display performance of the display device. Further, the film where the second active layer 221 is positioned is disposed on one side, facing away from the substrate 10, of the film where the first active layer 211 is positioned; and along the direction perpendicular to the plane where the substrate 10 is positioned, the film where the first active layer 211 is positioned, the film where the first A electrode 213 is positioned, the film where the first B electrode 212 is positioned, and the film where the first gate electrode 214 is positioned are all disposed between the film where the second active layer 221 is positioned and the substrate 10, that is, the first active layer 211, the first gate electrode 214, the first A electrode 213 and the first B electrode 212 are all positioned in a film below the second active layer 221. That is, during manufacturing, firstly, the first active layer 211 and the first gate electrode 214 are manufactured; secondly, an insulating layer is manufactured on the first gate electrode 214 and then punched to leave exposed at least part of the first active layer 211, and the first A electrode 213 and the second gate electrode 224 are formed after a first-A-electrode contact region in the at least part of the first active layer 211 left exposed is cleaned by using the hydrofluoric acids, so that the first A electrode 213 is electrically connected to the first-A-electrode contact region; thirdly, another insulating layer is manufactured on one side, facing away from the substrate 10, of the first A electrode 213, the insulating layer and other insulating layers are punched to leave exposed at least part of the first active layer 211, and the first B electrode 212 is formed after a first-B-electrode contact region in the at least part of the first active layer 211 left exposed is cleaned by using the hydrofluoric acids, so that the first B electrode 212 is electrically connected to the first-B-electrode contact region; and finally, the second active layer 221 is manufactured. This can prevent the hydrofluoric acids from damaging the second active layer 221 when the first active layer 211 is cleaned by using the hydrofluoric acids when the first A electrode 213 and the first B electrode 212 are manufactured, and give full play to the advantages of high carrier mobility, low deposition temperature and high transparency of the second thin film transistor 22, thereby significantly improving the display effect of the display device. Additionally, the first A electrode 213 and the second gate electrode 224 are disposed in the same layer and can be manufactured in the same manufacturing process by using the same mask plate without the mask plates manufactured for the first A electrode 213 and the second gate electrode 224 separately. This can decrease the number of masks used in the array-substrate manufacturing method, thereby reducing the process cost and simplifying the process steps. Additionally, the first A electrode 213 and first B electrode 212 are positioned in different films. This can avoid reserving certain space along the direction parallel with the film when the first A electrode 213 and the first B 212 electrode are positioned in the same film, thereby reducing the occupation space of each of at least one pixel circuit and improving the pixel resolution of the display device.

Optionally, the substrate 10 provided by this embodiment of the present disclosure may be a flexible substrate or a rigid substrate, which is not limited in this embodiment of the present disclosure.

Optionally, one of the first A electrode 213 and the first B electrode 212 is a source electrode of the first thin film transistor 21, and the other one of the first A electrode 213 and the first B electrode 212 is a drain electrode of the first thin film transistor 21. Similarly, one of the second A electrode 222 and the second B electrode 223 is a source electrode of the first thin second transistor 22, and the other one of the second A electrode 222 and the second B electrode 223 is a drain electrode of the second thin film transistor 22.

Specifically, when the first thin film transistor 21 is an N-type thin film transistor, the first A electrode 213 is the drain electrode of the first thin film transistor 21 and the first B electrode 212 is the source electrode of the first thin film transistor 21; and when the first thin film transistor is a P-type thin film transistor, the first A electrode 213 is the source electrode of the first thin film transistor 21 and the first B electrode 212 is the drain electrode of the first thin film transistor 21. Similarly, when the second thin film transistor 22 is the N-type thin film transistor, the second A electrode 222 is the drain electrode of the second thin film transistor 22 and the second B electrode 223 is the source electrode of the second thin film transistor 22; and when the second thin film transistor 22 is the P-type thin film transistor, the second A electrode 222 is the source electrode of the second thin film transistor 22 and the second B electrode 223 is the drain electrode of the second thin film transistor 22.

In summary, in the array substrate provided by this embodiment of the present disclosure, the film where the first active layer is positioned, the film where the first A electrode is positioned, the film where the first B electrode is positioned, and the film where the first gate electrode is positioned are all positioned between the film where the second active layer is positioned and the substrate along the direction perpendicular to the plane where the substrate is positioned. This can prevent the second active layer, that is, the oxide semiconductor active layer, from being damaged to solve the problem in which the oxide semiconductor active layer of the oxide semiconductor thin film transistor is damaged in the manufacturing process of the low temperature polycrystalline silicon thin film transistor and the oxide semiconductor thin film transistor in the related art, and give full play to the advantages of the oxide semiconductor thin film transistor and the low temperature polycrystalline silicon thin film transistor, thereby improving the display performance. Additionally, the first A electrode and the second gate electrode are disposed in the same layer and can be manufactured in the same manufacturing process by using the same mask plate without the mask plates manufactured for the first A electrode and the second gate electrode separately. This can decrease the number of masks used in the array-substrate manufacturing method, thereby reducing the process cost and simplifying the process steps. Additionally, the first A electrode and first B electrode are positioned in different films. This can avoid reserving certain space along the direction parallel with the film when the first A electrode and the first B electrode are positioned in the same film, thereby reducing the occupation space of each of at least one pixel circuit and improving the pixel resolution of the display device.

Based on the above solution, optionally, continuing to refer to FIG. 2, the driving-circuit layer includes a first semiconductor layer B1, a first metal layer M1, a second metal layer MC, a third metal layer M2, a second semiconductor layer B2 and a fourth metal layer MD. The first metal layer M1 is positioned on one side, facing away from the substrate 10, of the first semiconductor layer B1. The second metal layer MC is positioned on one side, facing away from the substrate 10, of the first metal layer M1. The third metal layer M2 is positioned on one side, facing away from the substrate 10, of the second metal layer MC. The second semiconductor layer B2 is positioned on one side, facing away from the substrate 10, of the third metal layer M2. The fourth metal layer MD is positioned on one side, facing away from the substrate 10, of the second semiconductor layer B2. The first active layer 211 is positioned in the first semiconductor layer B1. The first gate electrode 214 is positioned in the first metal layer M1. The first A electrode 213 and the second gate electrode 224 are positioned in the second metal layer MC, and the first B electrode 212 is positioned in the third metal layer M2. The second active layer 221 is positioned in the second semiconductor layer B2. The second A electrode 222 and the second B electrode 223 are positioned in the fourth metal layer MD.

Optionally, in this embodiment, compared with multiple etched films in the related art for connecting the first A electrode 213 to the first active layer 211, fewer etched films are required in this embodiment for connecting the first A electrode 213 to the first active layer 211 since the first A electrode 213 is positioned in the second metal layer MC. This can avoid the circumstance where the process precision is difficult to control and thus the first active layer 211 is damaged when the multiple films are etched, thereby improving the reliability of the first thin film transistor 21. Additionally, the second A electrode 222 and the second B electrode 223 are positioned in the fourth metal layer MD, that is, the second A electrode 222 and the second B electrode 223 are disposed in the same layer, and can be manufactured in the same manufacturing process by using the same mask plate without mask plates manufactured for the second A electrode 222 and the second B electrode 223 separately. This can decrease the number of masks used in the array-substrate manufacturing method, thereby reducing the process cost and simplifying the process steps.

Based on the above solution, optionally, continuing to refer to FIG. 2, the array substrate further includes an etch stop layer 23, which is positioned between the second semiconductor layer B2 and the fourth metal layer MD. The material of the etch stop layer is silicon oxide.

In this embodiment, the etch stop layer 23 is disposed between the second semiconductor layer B2 and the fourth metal layer MD so that the second active layer 221 is prevented from being damaged when the fourth metal layer MD is etched and thereby the reliability of the second thin film transistor 22 is improved. Further, the material of the etch stop layer 23 is silicon oxide. When the material of the etch stop layer 23 is an organic material or silicon nitride, certain ions, for example, hydrogen ions, in the organic material or the silicon nitride may corrode the second active layer 221 (oxide semiconductor active layer), so the material of the etch stop layer 23 in this embodiment is silicon oxide to prevent the certain ions in the organic material or the silicon nitride corrosion from corroding the second active layer 221 (oxide semiconductor active layer), further improving the reliability of the second thin film transistor 22.

Figure 3:
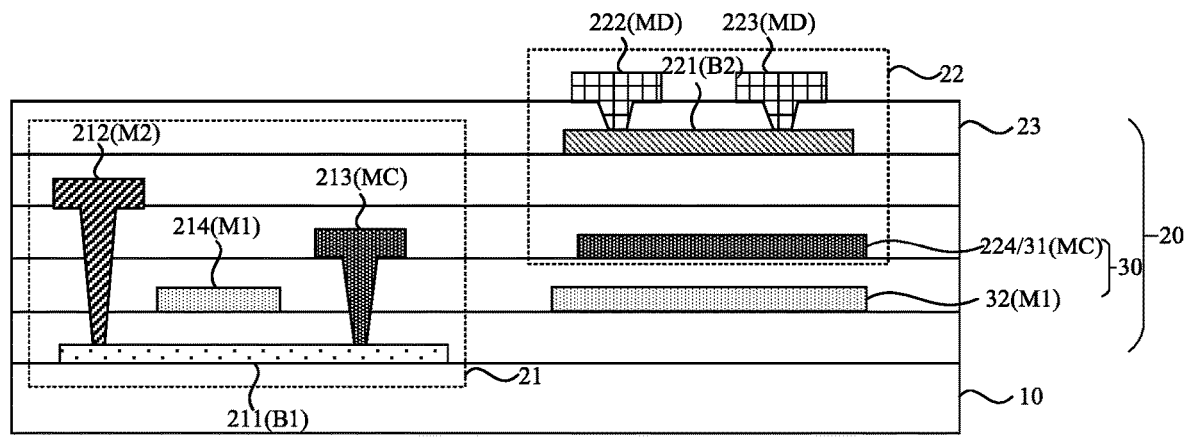
FIG. 3 is a structural diagram of another array substrate according to an embodiment of the present disclosure.

FIG. 3 is a structural diagram of another array substrate according to an embodiment of the present disclosure. Based on the above solution, optionally, referring to FIG. 3, each of at least one pixel circuit further includes a capacitor 30, which includes a first capacitance electrode 31 and a second capacitance electrode 32. The second gate electrode 224 is reused as the first capacitance electrode 31. The second capacitance electrode 32 is positioned in the first metal layer M1. The second capacitance electrode 32 and the second gate electrode 224 have an overlapping portion in a direction perpendicular to the substrate 10.

Exemplarily, the second capacitance electrode 32 and the second gate electrode 224 (reused as the first capacitance electrode 31) have an overlapping portion in a direction perpendicular to the substrate 10, so as to form the capacitor 30 in each of at least one pixel circuit. The second gate electrode 224 is reused as the first capacitance electrode 31, that is, when manufactured, the second gate electrode 224 and the first capacitance electrode 31 of the capacitor 30 can be manufactured in the same manufacturing process by using the same mask plate without mask plates manufactured for the second gate electrode 224 and the first capacitance electrode 31 of the capacitor 30 separately. The second capacitance electrode 32 is positioned in the first metal layer M1, so when manufactured, the second capacitance electrode 32 and the first gate electrode 214 can be manufactured in the same manufacturing process by using the same mask plate without mask plates manufactured for the second capacitance electrode 32 and the first gate electrode 214 separately. This can save the cost and decrease the number of manufacturing processes, thereby improving the production efficiency.

Figure 4:
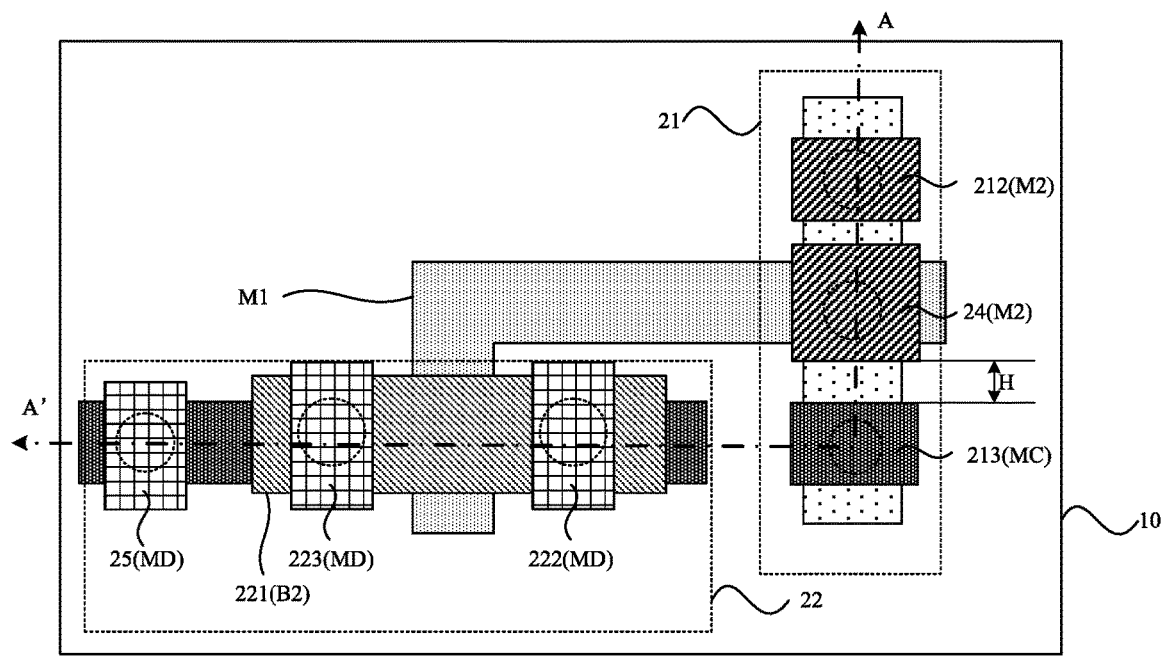
FIG. 4 is a plan view of an array substrate according to an embodiment of the present disclosure.
Figure 5:
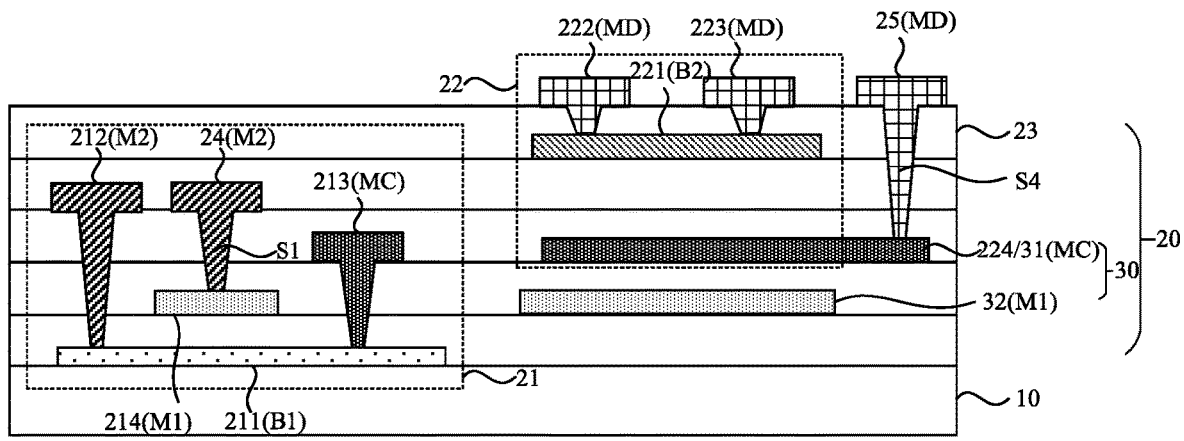
FIG. 5 is a sectional view taken along section line A-A' of FIG. 4.

FIG. 4 is a plan view of an array substrate according to an embodiment of the present disclosure. FIG. 5 is a sectional view taken along section line A-A' of FIG. 4. Based on the above solution, optionally, referring to FIGS. 4 and 5, the third metal layer M2 further includes a first connecting wire 24, and the first gate electrode 214 is connected to the first connecting wire 24 through a first via S1.

Exemplarily, a corresponding signal may be provided to the first thin film transistor 21 through the first connecting wire 24. The first connecting wire 24 is positioned in the third metal layer M2 further, so when manufactured, the first B electrode 212 and the first connecting wire 24 can be manufactured in the same manufacturing process by using the same mask plate without a mask plate specifically manufactured for the first connecting wire 24. This can save the cost and decrease the number of manufacturing processes, thereby improving the production efficiency.

It is to be emphasized that, continuing to refer to FIGS. 4 and 5, the first B electrode 212 and the first connecting wire 24 are disposed in the same layer, but the first A electrode 213, the first gate electrode 214 and the first connecting wire 24 are disposed in different layers in this embodiment. This can avoid reserving certain space (that is, the value of H will become greater) along the direction parallel with the film when the first A electrode 213 is positioned in the same film as the first connecting wire 24 or the first gate electrode 214, thereby reducing the occupation space of each of at least one pixel circuit and improving the pixel resolution of the display device.

Figure 6:
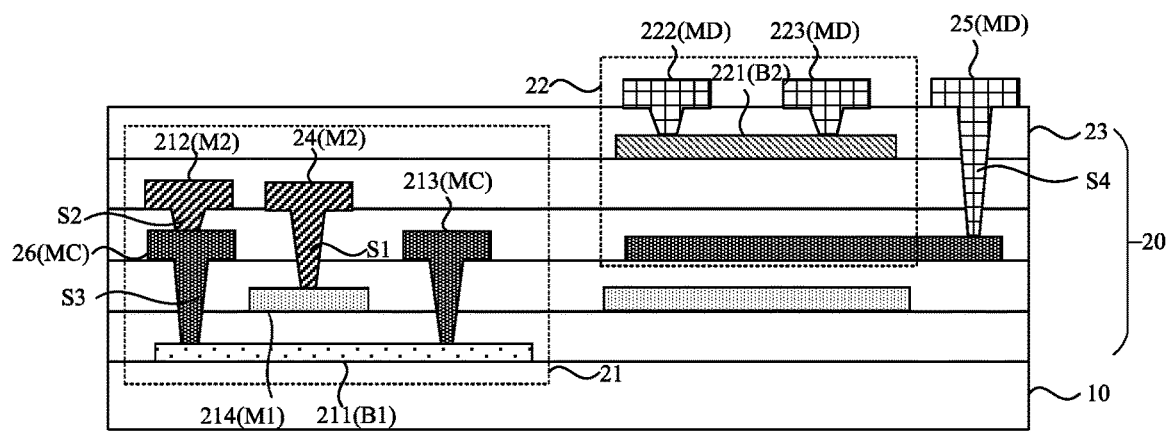
FIG. 6 is a structural diagram of another array substrate according to an embodiment of the present disclosure.

FIG. 6 is a structural diagram of another array substrate according to an embodiment of the present disclosure. Based on the above solution, optionally, referring to FIG. 6, the second metal layer MC further includes a first assistant connecting block 26, the first B electrode 212 is electrically connected to the first assistant connecting block 26 through a second via S2, and the first assistant connecting block 26 is connected to the first active layer 211 through a third via S3.

When the first B electrode 212 is electrically connected to the first active layer 211 through only one via, the one via needs to penetrate multiple films and may damage the first active layer 211. Therefore, in this technical solution, the first assistant connecting block 26 is disposed between the first B electrode 212 and the first active layer 211, the first B electrode 212 is electrically connected to the first assistant connecting block 26 through the second via S2, and the first assistant connecting block 26 is connected to the first active layer 211 through the third via S3. That is, the second via S2 and the third via S3 are formed through twice etching and have a less etching depth and higher precision than the via through which the first B electrode 212 is connected to the first active layer 211. This reduces the damage to the first active layer 211 during etching and improves the reliability of the first thin film transistor 21. When manufactured, firstly, the first active layer 211 and the first gate electrode 214 are manufactured; secondly, the insulating layer is manufactured on the first gate electrode 214 and then punched to leave exposed at least part of the first active layer 211, and the first A electrode 213 and the first assistant connecting block 26 are formed after the first-A-electrode contact region and the first-B-electrode contact region in the at least part of the first active layer 211 left exposed is cleaned by using the hydrofluoric acids, so that the first A electrode 213 is electrically connected to the first-A-electrode contact region and the first assistant connecting block 26 is electrically connected to the first-B-electrode contact region; thirdly, the other insulating layer is manufactured on one side, facing away from the substrate 10, of the first A electrode 213, the other insulating layer and other insulating layers are punched to form a via and leave exposed at least part of the first assistant connecting block 26, and the first B electrode 212 is formed in the via and connected to the first assistant connecting block 26, so that the first B electrode 212 is electrically connected to the first-B-electrode contact region; and finally, the second active layer 221 is manufactured. This can prevent the hydrofluoric acids from damaging the second active layer 221 when the first active layer 211 is cleaned by using the hydrofluoric acids when the first A electrode 213 and the first B electrode 212 are manufactured, and give full play to the advantages, such as of the high carrier mobility, the low deposition temperature and the high transparency, of the second thin film transistor 22, thereby significantly improving the display effect of the display device. The first assistance block 26 is positioned in the second metal layer M2, that is, when manufactured, the first A electrode 213 and the first assistant connecting block 26 can be manufactured in the same manufacturing process by using the same mask plate without a mask plate specifically manufactured for the first assistant connecting block 26. This can save the cost and decrease the number of manufacturing processes, thereby improving the production efficiency.

Based on the above solution, optionally, continuing to refer to FIGS. 4 and 5, the fourth metal layer MD further includes a second connecting wire 25, and the second gate electrode 224 is connected to the second connecting wire 25 through a fourth via S4.

Exemplarily, a corresponding signal may be provided to the second thin film transistor 22 through the second connecting wire 25. The second connecting wire 25 is positioned in the fourth metal layer MD, so when manufactured, the second B electrode 223 and the fourth metal layer MD can be manufactured in the same manufacturing process by using the same mask plate without a mask plate specifically manufactured for the second connecting wire 25. This can save the cost and decrease the number of manufacturing processes, thereby improving the production efficiency.

Figure 7:
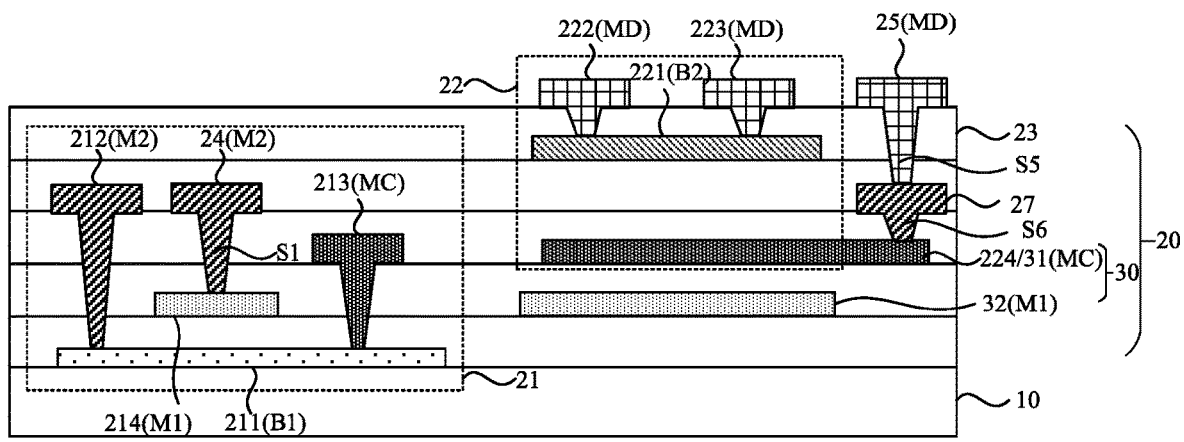
FIG. 7 is a structural diagram of another array substrate according to an embodiment of the present disclosure.

FIG. 7 is a structural diagram of another array substrate according to an embodiment of the present disclosure. Based on the above solution, optionally, referring to FIG. 7, the third metal layer M2 further includes a second assistant connecting block 27, the second connecting wire 25 is electrically connected to the second assistant connecting block 27 through a fifth via S5, and the second assistant connecting block 27 is connected to the second gate electrode 224 through a sixth via S6.

When the second connecting wire 25 is electrically connected to the second gate electrode 224 through only one via, the one via needs to penetrate multiple films and may damage the second gate electrode 224. Therefore, in this technical solution, the second assistant connecting block 27 is disposed between the second connecting wire 25 and the second gate 224, the second connecting wire 25 is electrically connected to the second assistant connecting block 27 through the fifth via S5, and the second assistant connecting block 27 is connected to the second gate electrode 224 through the sixth via S6. That is, the fifth via S5 and the sixth via S6 are formed through twice etching and have a less etching depth and higher precision compared with the via through which the second connecting wire 25 is connected to the second gate electrode 224. This reduces the damage to the second gate electrode 224 during the etching, and improves the reliability of the second thin film transistor 22.

Additionally, the second assistance block 27 is positioned in the third metal layer M2, that is, when manufactured, the first B electrode 212 and the second assistant connecting block 27 can be manufactured in the same manufacturing process by using the same mask plate without a mask plate specifically manufactured for the second assistant connecting block 27. This can save the cost and decrease the number of manufacturing processes, thereby improving the production efficiency.

Figure 8:
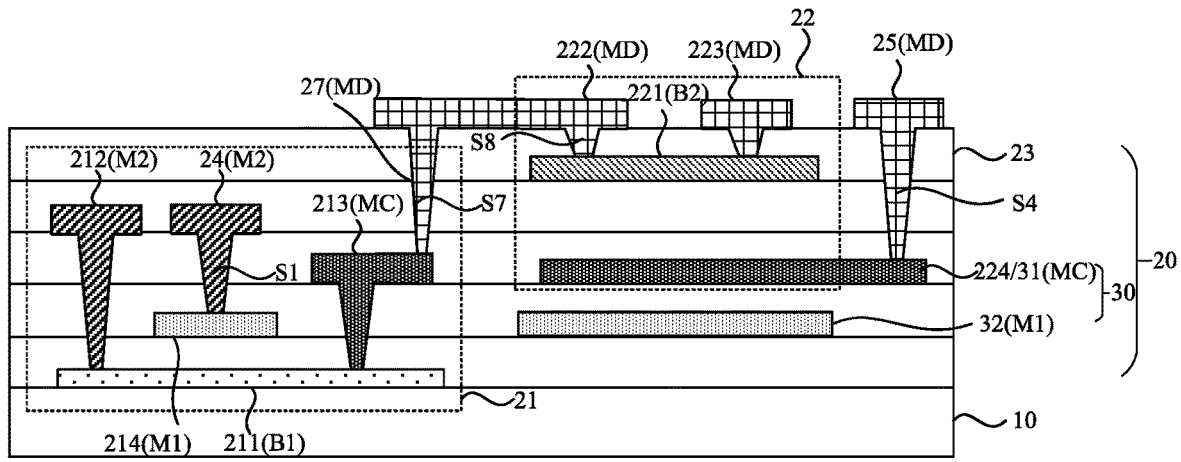
FIG. 8 is a structural diagram of another array substrate according to an embodiment of the present disclosure.

FIG. 8 is a structural diagram of another array substrate according to an embodiment of the present disclosure. Based on the above solution, optionally, referring to FIG. 8, the array substrate further includes a connecting portion 27. The connecting portion 27 is connected to the second A electrode 222 and disposed in the same layer as the second A electrode 222. The connecting portion 27 is electrically connected to the first A electrode 213 through a seventh via S7, and the second A electrode 222 is electrically connected to the second active layer 221 through an eighth via S8.

Exemplarily, the first thin film transistor 21 is electrically connected to the second thin film transistor 22 through the connecting portion 27. The first thin film transistor 21 includes the low temperature polycrystalline silicon active layer, and the second thin film transistor 22 includes the oxide semiconductor active layer. This can ensure that the advantages of the low temperature polycrystalline silicon thin film transistor and the oxide semiconductor thin film transistor are given full play, thereby ensuring the good display performance of the display device. Additionally, the second A electrode 222 is electrically connected to the second active layer 221 through the eighth via S8 and the eighth via S8 has a less etching depth and higher precision. This reduces the damage to the second active layer 221 during the etching, and improves the reliability of the second thin film transistor 22.

Figure 9:
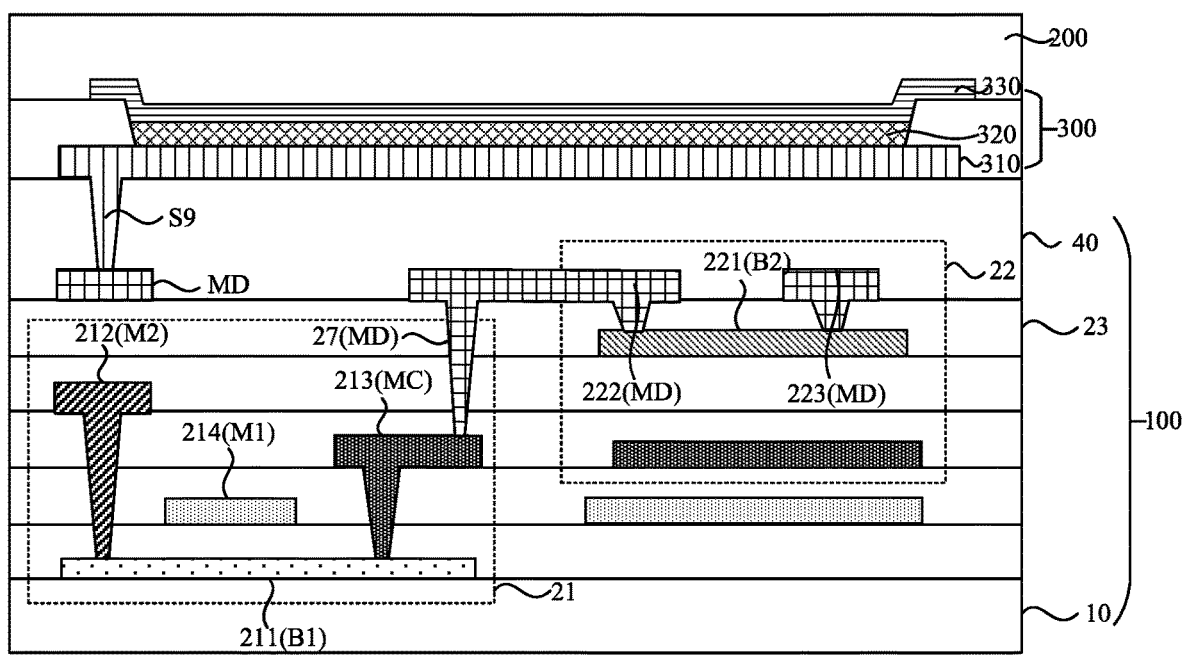
FIG. 9 is a structural diagram of a display panel according to an embodiment of the present disclosure.

Base on the same inventive concept, an embodiment of the present disclosure further provides a display panel. FIG. 9 is a structural diagram of a display panel according to this embodiment of the present disclosure. Referring to FIG. 9, the display panel provided by this embodiment of the present disclosure includes the array substrate 100 of this embodiment of the present disclosure, an opposing substrate 200 disposed opposite to the array substrate 100, and multiple light-emitting elements disposed between the array substrate 100 and the opposing substrate 200. The multiple pixel circuits are used for driving the multiple light-emitting elements to emit light. Optionally, each light-emitting element 300 may include an anode electrode 310, a light-emitting material layer 320 and a cathode electrode 330 that are stacked together. Optionally, the opposing substrate 200 may include, for example, a polarizer, a touch substrate or the like. Optionally, the display panel provided by this embodiment of the present disclosure may further include an encapsulation layer (not shown in the figure). The encapsulation layer is disposed between the multiple light-emitting elements 300 and the opposing substrate 200 and used for providing water and oxygen protection for the multiple light-emitting elements 300. Optionally, the encapsulation layer may be a glass encapsulation layer or a thin film encapsulation layer, which is not limited in this embodiment of the present disclosure.

Based on the above solution, optionally, continuing to refer to FIG. 9, the driving-circuit layer includes the first semiconductor layer B1, the first metal layer M1, the second metal layer MC, the third metal layer M2, the second semiconductor layer B2 and the fourth metal layer MD. The first metal layer M1 is positioned on one side, facing away from the substrate 10, of the first semiconductor layer B1. The second metal layer MC is positioned on one side, facing away from the substrate 10, of the first metal layer M1. The third metal layer M2 is positioned on one side, facing away from the substrate 10, of the second metal layer MC. The second semiconductor layer B2 is positioned on one side, facing away from the substrate 10, of the third metal layer M2. The fourth metal layer MD is positioned on one side, facing away from the substrate 10, of the second semiconductor layer B2. The first active layer 211 is positioned in the first semiconductor layer B1. The first gate electrode 214 is positioned in the first metal layer M1. The first A electrode 213 and the second gate electrode 224 are positioned in the second metal layer MC, and the first B electrode 212 is positioned in the third metal layer M2. The second active layer 221 is positioned in the second semiconductor layer B2. The second A electrode 222 and the second B electrode 223 are positioned in the fourth metal layer MD. The array substrate 100 further includes a planarization layer 40, which is positioned on one side, facing away from the substrate 10, of the fourth metal layer MD. The multiple light-emitting elements 300 are positioned on one side, facing away from the substrate 10, of the planarization layer 40. The array substrate 100 is provided with a ninth via S9, which penetrates the planarization layer 40 and leaves at least part of the fourth metal layer MD. The multiple light-emitting elements 300 are connected, through the ninth via S9, to the at least part of the fourth metal layer MD left exposed by the ninth via S9.

Figure 10:
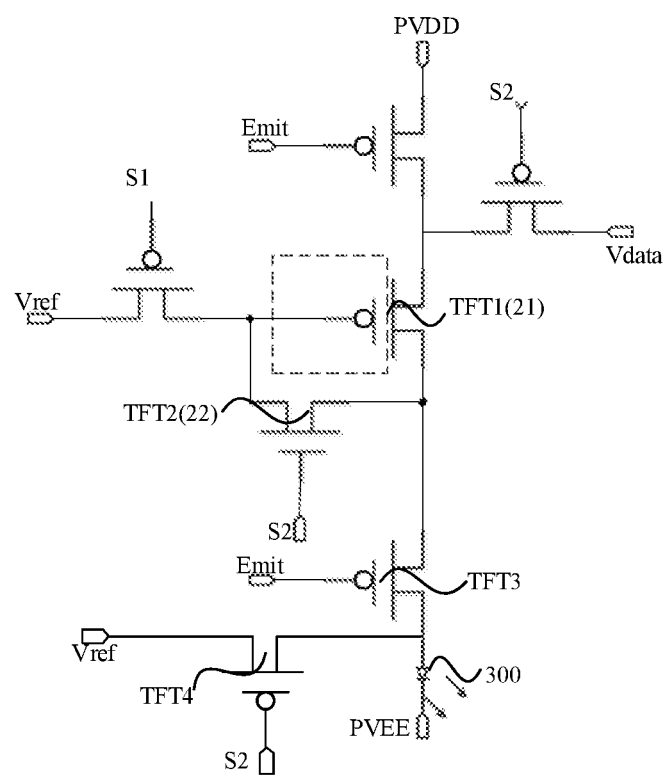
FIG. 10 is a structural diagram of a pixel circuit according to an embodiment of the present disclosure.

Exemplarily, FIG. 10 is a structural diagram of a pixel circuit according to an embodiment of the present disclosure. Referring to FIG. 10, the pixel circuit includes multiple thin film transistors. Optionally, thin film transistor TFT1 may be, for example, the first thin film transistor 21 provided in the above technical solution of the present application, and thin film transistor TFT2 may be, for example, the second thin film transistor 22 provided in the above technical solution of the present application. A source electrode or a drain electrode of thin film transistor TFT3 or a source electrode or a drain electrode of thin film transistor TFT4 is connected to the anode electrode 310 of a light-emitting element 300. When positioned in the fourth metal layer MD, the source electrode or the drain electrode of thin film transistor TFT3, or the source electrode or the drain electrode of thin film transistor TFT4 electrically connected to the anode electrode 310 of the light-emitting element 300 may be connected, through the ninth via S9 (penetrating the planarization layer 40 and leaving the at least part of the fourth metal layer MD) disposed in the array substrate 100, to the at least part of the fourth metal layer MD left exposed by the ninth via S9, so that the light emitting element 300 can be driven to emit light through the pixel circuit.

Figure 11:
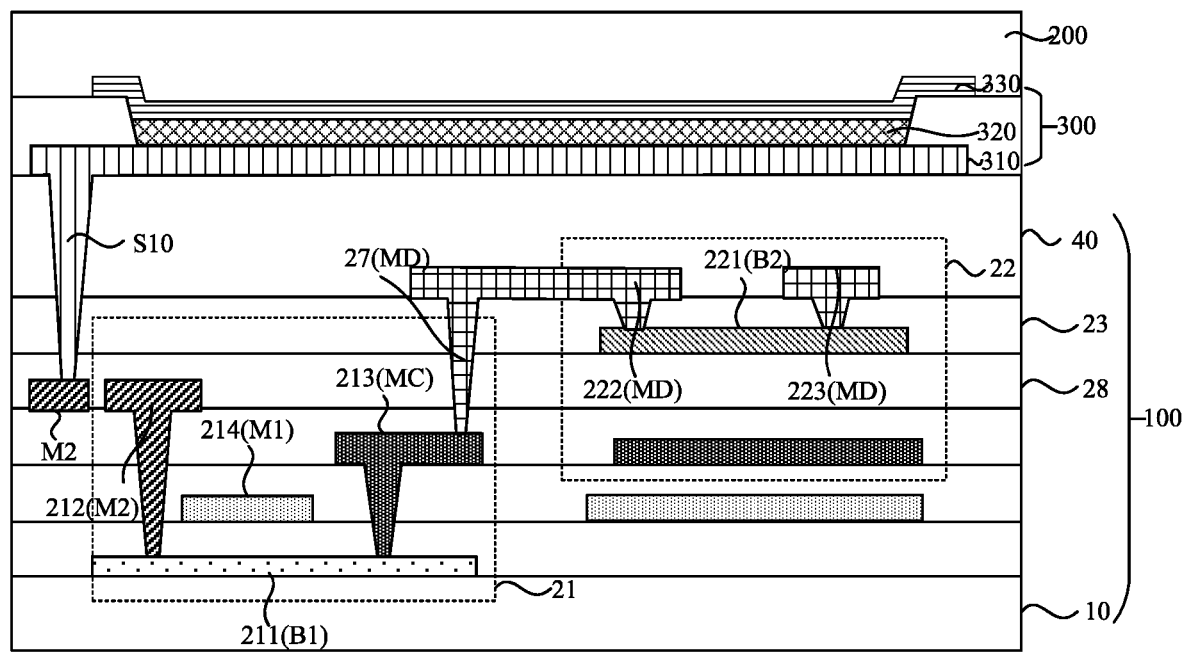
FIG. 11 is a structural diagram of another display panel according to an embodiment of the present disclosure.

FIG. 11 is a structural diagram of another display panel according to an embodiment of the present disclosure. Optionally, the driving-circuit layer includes the first semiconductor layer B1, the first metal layer M1, the second metal layer MC, the third metal layer M2, the second semiconductor layer B2 and the fourth metal layer MD. The first metal layer M1 is positioned on one side, facing away from the substrate 10, of the first semiconductor layer B 1. The second metal layer MC is positioned on one side, facing away from the substrate 10, of the first metal layer M1. The third metal layer M2 is positioned on one side, facing away from the substrate 10, of the second metal layer MC. The second semiconductor layer B2 is positioned on one side, facing away from the substrate 10, of the third metal layer M2. The fourth metal layer MD is positioned on one side, facing away from the substrate 10, of the second semiconductor layer B2. The first active layer 211 is positioned in the first semiconductor layer B1. The first gate electrode 214 is positioned in the first metal layer M1. The first A electrode 213 and the second gate electrode 224 are positioned in the second metal layer MC, and the first B electrode 212 is positioned in the third metal layer M2. The second active layer 221 is positioned in the second semiconductor layer B2. The second A electrode 222 and the second B electrode 223 are positioned in the fourth metal layer MD. The array substrate 100 further includes the planarization layer 40, which is positioned on one side, facing away from the substrate 10, of the film where the second A electrode 222 is positioned and the film where the second B electrode 223 is positioned. The array substrate further includes an etch stop layer 23, which is positioned between the second semiconductor layer B2 and the fourth metal layer MD. The array substrate further includes a gate insulating layer 28, which is positioned between the second semiconductor layer B2 and the third metal layer M2. The array substrate 100 is provided with a tenth via S10, which penetrates the planarization layer 40, the etch stop layer 23 and the gate insulating layer 28 and leaves exposed at least part of the third metal layer M2. The multiple light-emitting elements 300 are positioned on one side, facing away from the substrate 10, of the planarization layer 40. The multiple light-emitting elements 300 are connected, through the tenth via S10, to the at least part of the third metal layer M2 left exposed by the tenth via S10.

Exemplarily, continuing to referring to FIGS. 10 and 11, when positioned in the third metal layer M2, the source electrode or the drain electrode of thin film transistor TFT3 or the source electrode or the drain electrode of thin film transistor TFT4 electrically connected to the anode electrode 310 of the light-emitting element 300 may be connected, through the tenth via S10 (penetrating the planarization layer 40, the etch stop layer 23 and the gate insulating layer 28 and leaving exposed the at least part of the third metal layer M2) disposed in the array substrate 100, to the at least part of the third metal layer M2 left exposed by the tenth via S10, so that the light emitting element 300 can be driven to emit light through the pixel circuit.

Figure 12:
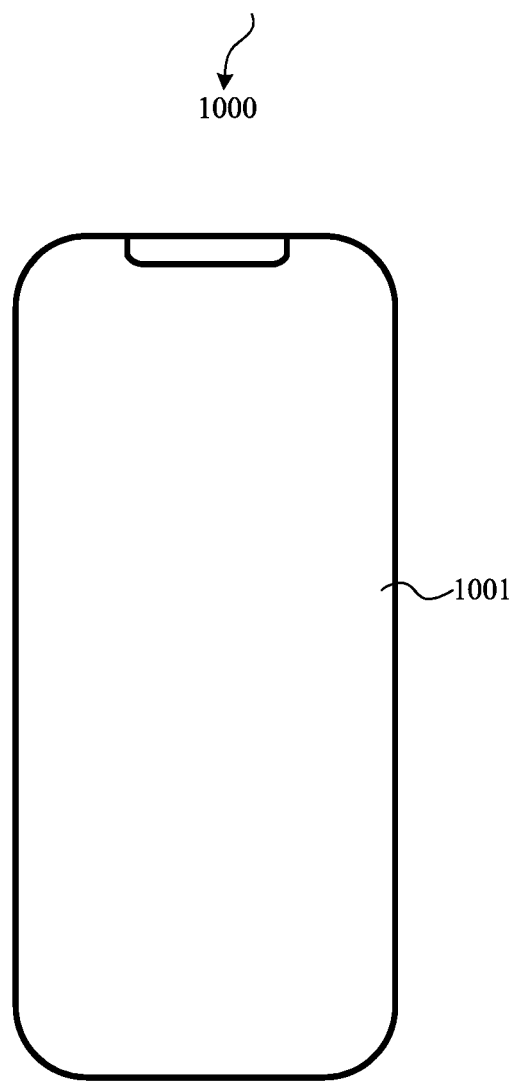
FIG. 12 is a structural diagram of a display device according to an embodiment of the present disclosure.

Based on the same inventive concept, an embodiment of the present disclosure further provides a display device. FIG. 12 is a schematic diagram of a display device according to this embodiment of the present disclosure. The display device 1000 provided by this embodiment of the present disclosure includes the display panel 1001 according to any embodiment of the present disclosure. Optionally, the display device provided by this embodiment of the present disclosure may be a mobile phone shown in FIG. 12, or may be a computer, a television, an smart wearable display device or the like, which is not specifically limited in this embodiment of the present disclosure.

Figure 13:
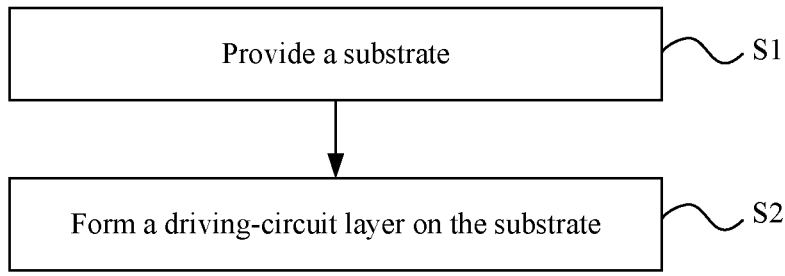
FIG. 13 is a flowchart of an array-substrate manufacturing method according to an embodiment of the present disclosure.

Based on the same inventive concept, an embodiment of the present disclosure further provides an array-substrate manufacturing method. FIG. 13 is a flowchart of an array-substrate manufacturing method according to this embodiment of the present disclosure. Referring to FIG. 13, the array-substrate manufacturing method includes the steps described below.

In step S1, a substrate provided.

In step S2, a driving-circuit layer is formed on the substrate. The driving-circuit layer includes multiple pixel circuits. Each of at least one of the multiple pixel circuits includes a first thin film transistor, a second thin film transistor and a capacitor. The first thin film transistor includes a first active layer, a first gate electrode, a first A electrode and a first B electrode, and the first active layer includes a low temperature polycrystalline silicon active layer. The second thin film transistor includes a second active layer, a second gate electrode, a second A electrode and a second B electrode, and the second active layer includes an oxide semiconductor active layer. Along a direction perpendicular to a plane where the substrate is positioned, a film where the first active layer is positioned, a film where the first A electrode is positioned, a film where the first B electrode is positioned, and a film where the first gate electrode is positioned are all positioned between a film where the second active layer is positioned and the substrate. A film where the second A electrode is positioned and a film where the second B electrode is positioned are both positioned on one side, facing away from the substrate, of the film where the second active layer is positioned. The first A electrode is disposed in a different layer than the first B electrode. The first A electrode is disposed in the same layer as the second gate electrode.

In the array-substrate manufacturing method provided by this embodiment of the present disclosure, during the manufacturing process, the first active layer, the first gate electrode, the first A electrode and the first B electrode of the first thin film transistor are formed firstly, and then the second active layer of the second thin film transistor is formed. This can prevent the second active layer, that is, the oxide semiconductor active layer, from being damaged, solve the problem in which the oxide semiconductor active layer of the oxide semiconductor thin film transistor is damaged in the manufacturing process of the low temperature polycrystalline silicon thin film transistor and the oxide semiconductor thin film transistor in the related art, and give full play to advantages of the oxide semiconductor thin film transistor and the low temperature polycrystalline silicon thin film transistor, thereby improving the display performance. Additionally, the first A electrode and the second gate electrode are disposed in the same layer and can be manufactured in the same manufacturing process by using the same mask plate without mask plates manufactured for the first A electrode and the second gate electrode separately. This can decrease the number of masks used in the array-substrate manufacturing method, thereby reducing the process cost and simplifying the process steps. Additionally, the first A electrode and first B electrode are positioned in different films. This can avoid reserving certain space along a direction parallel with the film when the first A electrode and the first B electrode are positioned in the same film, thereby reducing the occupation space of each of at least one pixel circuit and improving the pixel resolution of a display device.

Figure 14:
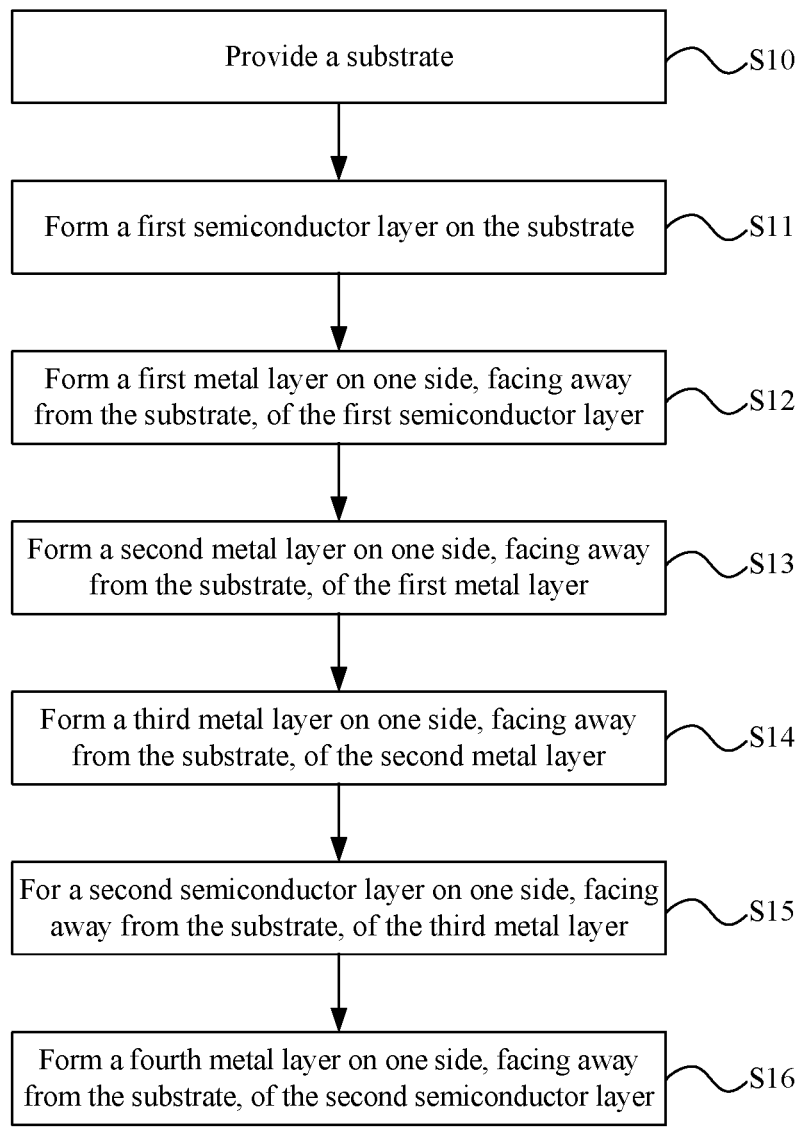
FIG. 14 is a flowchart of another array-substrate manufacturing method according to an embodiment of the present disclosure.

FIG. 14 is a flowchart of another array-substrate manufacturing method according to an embodiment of the present disclosure. Based on the above solution, optionally, referring to FIG. 14, the array-substrate manufacturing method includes the steps described below.

In step S10, the substrate is provided.

Figure 15:
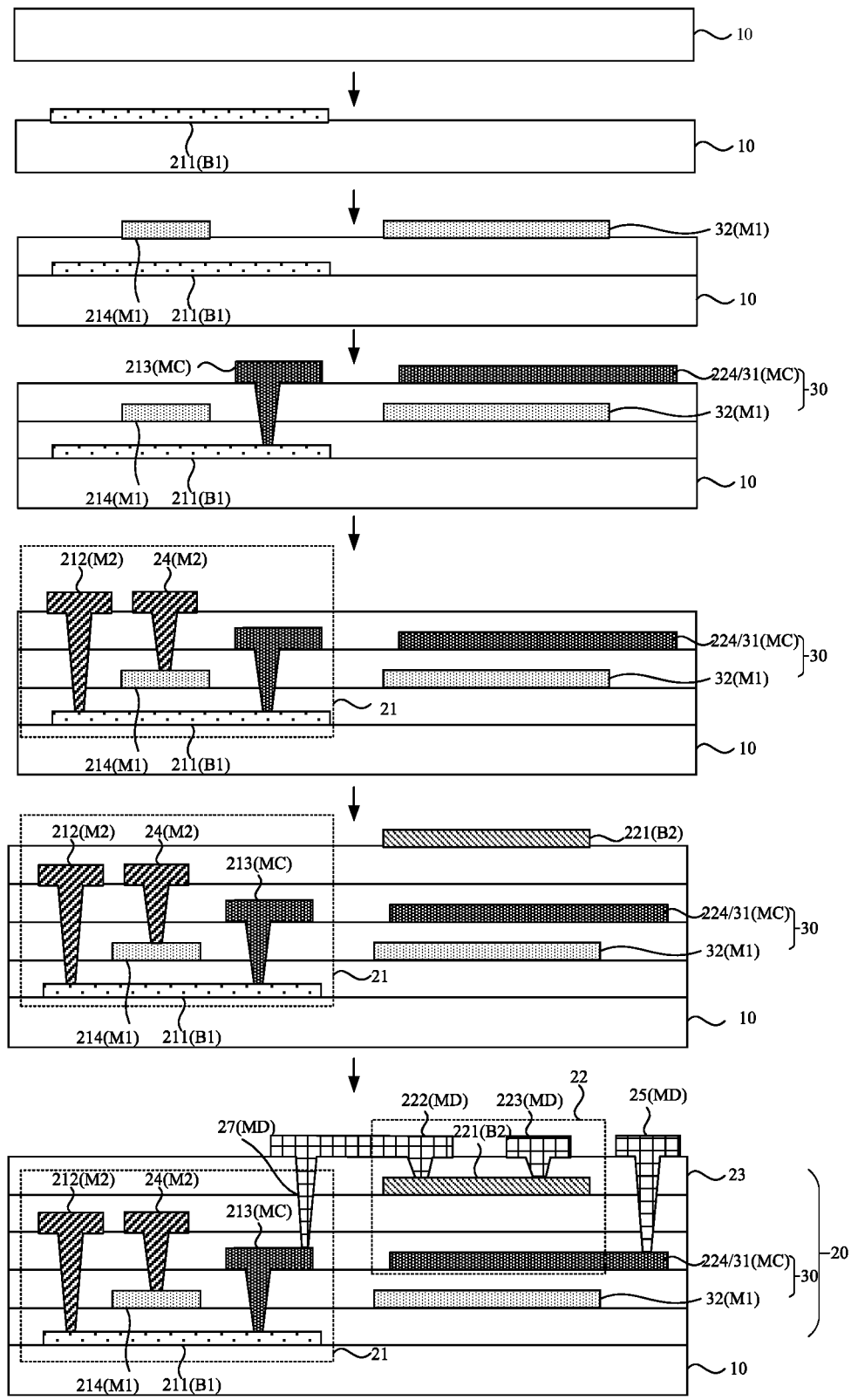
FIG. 15 is a structural diagram of an array-substrate manufacturing process corresponding to FIG. 14.

Specifically, referring to FIG. 15, various films of the array substrate are formed step by step in multiple manufacturing processes. When the various films of the array substrate are formed, the substrate 10 provides support and protection for the various films. The substrate 10 may be a flexible substrate or a rigid substrate, which is not limited in this embodiment of the present disclosure.

In step S11, a first semiconductor layer is formed on the substrate.

Specifically, referring to FIG. 15, the first active layer 211 is positioned in a first semiconductor layer B1. The first active layer 211 includes a low temperature polycrystalline silicon active layer.

In step S12, a first metal layer is formed on one side, facing away from the substrate, of the first semiconductor layer.

Specifically, referring to FIG. 15, the first metal layer M1 is formed on one side, facing away from the substrate 10, of the first semiconductor layer B1, and the first gate electrode 214 and the second capacitance electrode 32 are positioned in the first metal layer M1. That is, the first gate electrode 214 and the second capacitance electrode 32 can be manufactured in the same manufacturing process by using the same mask plate without mask plates manufactured for the first gate electrode 214 and the second capacitance electrode 32 separately. This can save the cost and decrease the number of manufacturing processes, thereby improving the production efficiency.

In step S13, a second metal layer is formed on one side, facing away from the substrate, of the first metal layer.

Specifically, continuing to refer to FIG. 15, the second metal layer M2 is formed on one side, facing away from the substrate 10, of the first metal layer M1, the first A electrode 213 and the second gate electrode 224 are positioned in the second metal layer M2, and the second gate electrode 224 is reused as the first capacitance electrode 31 of the capacitor. That is, during manufacturing, an insulating layer is manufactured on the first gate electrode 214 and then punched to leave exposed at least part of the first active layer 211, and the first A electrode 213 and the second gate electrode 224 are formed after a first-A-electrode contact region in the at least part of the first active layer 211 left exposed is cleaned by using hydrofluoric acids, so that the first A electrode 213 is electrically connected to the first-A-electrode contact region. Meanwhile, the second gate electrode 224 is reused as the first capacitance electrode 31 of the capacitor, and the first A electrode 213 and the second gate electrode 224 can be manufactured in the same manufacturing process by using the same mask plate without mask plates manufactured for the first A electrode 213 and the second gate electrode 224 separately. This can save the cost and decrease the number of manufacturing processes, thereby improving the production efficiency.

In step S14, a third metal layer is formed on one side, facing away from the substrate, of the second metal layer.

Specifically, continuing to refer to FIG. 15, the third metal layer M3 is formed on one side, facing away from the substrate 10, of the second metal layer M2, and the first B electrode 212 and a first connecting wire 24 are positioned in the third metal layer M3. The first connecting wire 24 may include, for example, a scan signal line, a reset signal line or a reference signal line. That is, when manufactured, another insulating layer is manufactured on one side, facing away from the substrate 10, of the first A electrode 213, the insulating layer and other insulating layers are punched to leave exposed at least part of the first active layer 211, and the first B electrode 212 is formed after a first-B-electrode contact region in the at least part of the first active layer 211 left exposed is cleaned by using the hydrofluoric acids, so that the first B electrode 212 is electrically connected to the first-B-electrode contact region. Meanwhile, the first B electrode 212 and the first connecting wire 24 can be manufactured in the same manufacturing process by using the same mask plate without mask plates manufactured for the first B electrode 212 and the first connecting wire 24 separately. This can save the cost and decrease the number of manufacturing processes, thereby improving the production efficiency. The first active layer 211, the first gate electrode 214, the first A electrode 213 and the first B electrode 212 constitute the first thin film transistor 21.

In step S15, a second semiconductor layer is formed on one side, facing away from the substrate, of the third metal layer.

Specifically, continuing to refer to FIG. 15, the second semiconductor layer B2 is formed on one side, facing away from the substrate 10, of the third metal layer M3, and the second active layer 221 is positioned in the second semiconductor layer B2. The film where the second active layer 221 is positioned is disposed on one side, facing away from the substrate 10, of the film where the first active layer 211 is positioned; and along the direction perpendicular to the plane where the substrate 10 is positioned, the film where the first active layer 211 is positioned, the film where the first A electrode 213 is positioned, the film where the first B electrode 212 is positioned, and the film where the first gate electrode 214 is positioned are all disposed between the film where the second active layer 221 is positioned and the substrate 10, that is, the first active layer 211, the first gate electrode 214, the first A electrode 213 and the first B electrode 212 are all positioned in a film below the second active layer 221. This can prevent the hydrofluoric acids from damaging the second active layer 221 when the first active layer 211 is cleaned by using the hydrofluoric acids when the first A electrode 213 and the first B electrode 212 are manufactured, and give full play to advantages, such as high carrier mobility, low deposition temperature and high transparency, of the second thin film transistor 22, thereby significantly improving the display effect of a display device.

In step S16, a fourth metal layer is formed on one side, facing away from the substrate, of the second semiconductor layer.

Specifically, continuing to refer to FIG. 15, the fourth metal layer M4 is formed on one side, facing away from the substrate 10, of the second semiconductor layer B2. The second A electrode 222, the second B electrode 223 and a second connecting wire 25 are positioned in the fourth metal layer M4. That is, when manufactured, the second A electrode 222, the second B electrode 223 and the second connecting wire 25 can be manufactured in the same manufacturing process by using the same mask plate without mask plates manufactured for the second A electrode 222, the second B electrode 223 and the second connecting wire 25 separately. This can save the cost and decrease the number of manufacturing processes, thereby improving the production efficiency. The second active layer 221, the second gate electrode 224, the second A electrode 222 and the second B electrode 223 constitute the second thin film transistor 22. Meanwhile, a connecting portion 27 is also positioned in the fourth metal layer M4. The first thin film transistor 21 is electrically connected to the second thin film transistor 22 through the connecting portion 27. Both the first thin film transistor 21 and the second thin film transistor 22 are disposed on the substrate 10, where the first thin film transistor 21 includes the low temperature polycrystalline silicon active layer and the second thin film transistor 22 includes the oxide semiconductor active layer. This can ensure that advantages of the low temperature polycrystalline silicon thin film transistor and the oxide semiconductor thin film transistor are given full play, thereby ensuring good display performance of the display device.

It is to be noted that the above are merely preferred embodiments of the present disclosure and the technical principles used therein. It will be understood by those skilled in the art that the present disclosure is not limited to the specific embodiments described herein, and that the features of the various embodiments of the present disclosure may be coupled or combined in part or in whole with each other, and may be collaborated with each other and technically driven in various ways. Those skilled in the art can make various apparent modifications, adaptations, combinations and substitutions without departing from the scope of the present disclosure. Therefore, while the present disclosure has been described in detail through the above embodiments, the present disclosure is not limited to the above embodiments and may include more other equivalent embodiments without departing from the inventive concept of the present disclosure. The scope of the present disclosure is determined by the scope of the appended claims.

What is claimed is:

1. An array substrate, comprising a substrate and a driving-circuit layer positioned on the substrate,
   wherein the driving-circuit layer comprises a plurality of pixel circuits;
   wherein each of at least one of the plurality of pixel circuits comprises a first thin film transistor and a second thin film transistor;
   wherein the first thin film transistor comprises a first active layer, a first gate electrode, a first A electrode and a first B electrode, and the first active layer comprises a low temperature polycrystalline silicon active layer; and the second thin film transistor comprises a second active layer, a second gate electrode, a second A electrode and a second B electrode, and the second active layer comprises an oxide semiconductor active layer;
   wherein along a direction perpendicular to a plane where the substrate is positioned, a film where the first active layer is positioned, a film where the first A electrode is positioned, a film where the first B electrode is positioned, and a film where the first gate electrode is positioned are all positioned between a film where the second active layer is positioned and the substrate;
   wherein a film where the second A electrode is positioned and a film where the second B electrode is positioned are both positioned on one side, facing away from the substrate, of the film where the second active layer is positioned;
   wherein the second gate electrode is positioned on one side, facing the substrate, of the second active layer;
   wherein the first A electrode is disposed in a different layer than the first B electrode; and
   wherein the first A electrode is disposed in a same layer as the second gate electrode.

2. The array substrate of claim 1, wherein
   the driving-circuit layer comprises a first semiconductor layer, a first metal layer, a second metal layer, a third metal layer, a second semiconductor layer and a fourth metal layer, wherein
   the first metal layer is positioned on one side, facing away from the substrate, of the first semiconductor layer; the second metal layer is positioned on one side, facing away from the substrate, of the first metal layer; the third metal layer is positioned on one side, facing away from the substrate, of the second metal layer; the second semiconductor layer is positioned on one side, facing away from the substrate, of the third metal layer; and the fourth metal layer is positioned on one side, facing away from the substrate, of the second semiconductor layer; and
   the first active layer is positioned in the first semiconductor layer, the first gate electrode is positioned in the first metal layer, the first A electrode and the second gate electrode are positioned in the second metal layer, the first B electrode is positioned in the third metal layer, the second active layer is positioned in the second semiconductor layer, and the second A electrode and the second B electrode are positioned in the fourth metal layer.

3. The array substrate of claim 2, further comprising an etch stop layer, which is positioned between the second semiconductor layer and the fourth metal layer,
   wherein a material of the etch stop layer is silicon oxide.

4. The array substrate of claim 2, wherein the each of the at least one of the plurality of pixel circuits further comprises a capacitor, which comprises a first capacitance electrode and a second capacitance electrode;
   wherein the second gate electrode is reused as the first capacitance electrode; and
   wherein the second capacitance electrode is positioned in the first metal layer, and the second capacitance electrode and the second gate electrode have an overlapping portion in a direction perpendicular to the substrate.

5. The array substrate of claim 2, wherein the third metal layer further comprises a connecting wire; and wherein the first gate electrode is connected to the first connecting wire through a via.

6. The array substrate of claim 2, wherein the second metal layer further comprises an assistant connecting block;
   wherein the first B electrode is electrically connected to the assistant connecting block through a via; and wherein the first assistant connecting block is connected to the first active layer through a different via.

7. The array substrate of claim 2, wherein the fourth metal layer further comprises a connecting wire; and wherein the second gate electrode is connected to the connecting wire through a first via.

8. The array substrate of claim 7, wherein the third metal layer further comprises an assistant connecting block;
wherein the connecting wire is electrically connected to the assistant connecting block through a second via; and
wherein the assistant connecting block is connected to the second gate electrode through a third via.

9. The array substrate of claim 2, further comprising a connecting portion, wherein the connecting portion is connected to the second A electrode and disposed in a same layer as the second A electrode; and wherein the connecting portion is electrically connected to the first A electrode through a via, and the second A electrode is electrically connected to the second active layer through an other via.

10. A display panel, comprising:
an array substrate;
an opposing substrate disposed opposite to the array substrate; and
a plurality of light-emitting elements disposed between the array substrate and the opposing substrate,
wherein the array substrate comprises a substrate and a driving-circuit layer positioned on the substrate, wherein the driving-circuit layer comprises a plurality of pixel circuits; wherein each of at least one of the plurality of pixel circuits comprises a first thin film transistor and a second thin film transistor; wherein the first thin film transistor comprises a first active layer, a first gate electrode, a first A electrode and a first B electrode, and the first active layer comprises a low temperature polycrystalline silicon active layer; and the second thin film transistor comprises a second active layer, a second gate electrode, a second A electrode and a second B electrode, and the second active layer comprises an oxide semiconductor active layer; wherein along a direction perpendicular to a plane where the substrate is positioned, a film where the first active layer is positioned, a film where the first A electrode is positioned, a film where the first B electrode is positioned, and a film where the first gate electrode is positioned are all positioned between a film where the second active layer is positioned and the substrate; wherein a film where the second A electrode is positioned and a film where the second B electrode is positioned are both positioned on one side, facing away from the substrate, of the film where the second active layer is positioned; wherein the second gate electrode is positioned on one side, facing the substrate, of the second active layer; wherein the first A electrode is disposed in a different layer than the first B electrode; and wherein the first A electrode is disposed in a same layer as the second gate electrode; and
wherein the plurality of pixel circuits are used for driving the plurality of light-emitting elements to emit light.

11. The display panel of claim 10, wherein the driving-circuit layer comprises a first semiconductor layer, a first metal layer, a second metal layer, a third metal layer, a second semiconductor layer and a fourth metal layer,
wherein the first metal layer is positioned on one side, facing away from the substrate, of the first semiconductor layer; the second metal layer is positioned on one side, facing away from the substrate, of the first metal layer; the third metal layer is positioned on one side, facing away from the substrate, of the second metal layer; the second semiconductor layer is positioned on one side, facing away from the substrate, of the third metal layer; the fourth metal layer is positioned on one side, facing away from the substrate, of the second semiconductor layer; and the first active layer is positioned in the first semiconductor layer, the first gate electrode is positioned in the first metal layer, the first A electrode and the second gate electrode are positioned in the second metal layer, the first B electrode is positioned in the third metal layer, the second active layer is positioned in the second semiconductor layer, and the second A electrode and the second B electrode are positioned in the fourth metal layer;
wherein the array substrate further comprises a planarization layer, which is positioned on one side, facing away from the substrate, of the fourth metal layer;
wherein the plurality of light-emitting elements are positioned on one side, facing away from the substrate, of the planarization layer;
wherein the array substrate is provided with a via, which penetrates the planarization layer and leaves exposed at least part of the fourth metal layer; and
wherein the plurality of light-emitting elements are connected, through the via, to the at least part of the fourth metal layer left exposed by the via.

12. The display panel of claim 10, wherein the driving-circuit layer comprises a first semiconductor layer, a first metal layer, a second metal layer, a third metal layer, a second semiconductor layer and a fourth metal layer, wherein the first metal layer is positioned on one side, facing away from the substrate, of the first semiconductor layer; the second metal layer is positioned on one side, facing away from the substrate, of the first metal layer; the third metal layer is positioned on one side, facing away from the substrate, of the second metal layer; the second semiconductor layer is positioned on one side, facing away from the substrate, of the third metal layer; the fourth metal layer is positioned on one side, facing away from the substrate, of the second semiconductor layer; and the first active layer is positioned in the first semiconductor layer, the first gate electrode is positioned in the first metal layer, the first A electrode and the second gate electrode are positioned in the second metal layer, the first B electrode is positioned in the third metal layer, the second active layer is positioned in the second semiconductor layer, and the second A electrode and the second B electrode are positioned in the fourth metal layer;
wherein the array substrate further comprises a planarization layer, which is positioned on one side, facing away from the substrate, of a film where the second A electrode is positioned and a film where the second B electrode is positioned;
wherein the array substrate further comprises an etch stop layer, which is positioned between the second semiconductor layer and the fourth metal layer;
wherein the array substrate further comprises a gate insulating layer, which is positioned between the second semiconductor layer and the third metal layer;
wherein the array substrate is provided with a via, which penetrates the planarization layer, the etch stop layer and the gate insulating layer, and leaves exposed at least part of the third metal layer;
wherein the plurality of light-emitting elements are positioned on one side, facing away from the substrate, of the planarization layer; and wherein the plurality of light-emitting elements are connected, through the via, to the at least part of the third metal layer left exposed by the via.

13. A display device, comprising the display panel of claim 10.

14. An array-substrate manufacturing method, comprising:

providing a substrate; and forming a driving-circuit layer on the substrate, wherein the driving-circuit layer comprises a plurality of pixel circuits; each of at least one of the plurality of pixel circuits comprises a first thin film transistor, a second thin film transistor and a capacitor; the first thin film transistor comprises a first active layer, a first gate electrode, a first A electrode and a first B electrode, and the first active layer comprises a low temperature polycrystalline silicon active layer; the second thin film transistor comprises a second active layer, a second gate electrode, a second A electrode and a second B electrode, and the second active layer comprises an oxide semiconductor active layer; along a direction perpendicular to a plane where the substrate is positioned, a film where the first active layer is positioned, a film where the first A electrode is positioned, a film where the first B electrode is positioned, and a film where the first gate electrode is positioned are all positioned between a film where the second active layer is positioned and the substrate; a film where the second A electrode is positioned and a film where the second B electrode is positioned are both positioned on one side, facing away from the substrate, of the film where the second active layer is positioned; the first A electrode is disposed in a different layer than the first B electrode; and the first A electrode is disposed in a same layer as the second gate electrode.

15. The array-substrate manufacturing method of claim 14, wherein forming the driving-circuit layer on the substrate comprises:

forming a first semiconductor layer on the substrate;

forming a first metal layer on one side, facing away from the substrate, of the first semiconductor layer;

forming a second metal layer on one side, facing away from the substrate, of the first metal layer;

forming a third metal layer on one side, facing away from the substrate, of the second metal layer;

forming a second semiconductor layer on one side, facing away from the substrate, of the third metal layer; and forming a fourth metal layer on one side, facing away from the substrate, of the second semiconductor layer, wherein the first active layer is positioned in the first semiconductor layer, the first gate electrode is positioned in the first metal layer, the first A electrode and the second gate electrode are positioned in the second metal layer, and the first B electrode is positioned in the third metal layer, the second active layer is positioned in the second semiconductor layer, and the second A electrode and the second B electrode are positioned in the fourth metal layer.

* * * * *